United States Patent
Nickel et al.

(10) Patent No.: US 9,285,419 B2
(45) Date of Patent: Mar. 15, 2016

(54) TEST PROBE ALIGNMENT STRUCTURES FOR RADIO-FREQUENCY TEST SYSTEMS

(75) Inventors: Joshua G. Nickel, San Jose, CA (US); Jr-Yi Shen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1294 days.

(21) Appl. No.: 13/173,387

(22) Filed: Jun. 30, 2011

(65) Prior Publication Data
US 2013/0002280 A1   Jan. 3, 2013

(51) Int. Cl.
G01R 31/00   (2006.01)
G01R 31/28   (2006.01)
H04B 17/00   (2015.01)
G01R 29/10   (2006.01)
G01R 31/302  (2006.01)

(52) U.S. Cl.
CPC ............ G01R 31/2891 (2013.01); *G01R 29/10* (2013.01); *G01R 31/3025* (2013.01); *H04B 17/0032* (2013.01); *H04B 17/0045* (2013.01)

(58) Field of Classification Search
CPC .............. G01R 29/10; G01R 31/2891; G01R 31/3025; H04B 17/0032; H04B 17/0045
See application file for complete search history.

(56) References Cited

U.S. PATENT DOCUMENTS

| | | | |
|---|---|---|---|
| 5,300,881 A | 4/1994 | Ferrer et al. | |
| 7,081,869 B2* | 7/2006 | Sommerfeld et al. | 343/906 |
| 7,102,517 B2* | 9/2006 | Reyes et al. | 340/572.1 |
| 7,165,003 B2* | 1/2007 | Mok | 702/118 |
| 7,265,536 B2 | 9/2007 | Kiesewetter et al. | |
| 7,936,176 B2 | 5/2011 | Nielsen et al. | |
| 2004/0207422 A1* | 10/2004 | Lehtinen et al. | 324/758 |
| 2007/0164770 A1 | 7/2007 | Casler, Jr. et al. | |
| 2008/0129614 A1* | 6/2008 | Raimann | H01Q 1/241 343/703 |
| 2010/0001742 A1 | 1/2010 | Strid et al. | |
| 2010/0090704 A1* | 4/2010 | Chen et al. | 324/537 |
| 2010/0277197 A1* | 11/2010 | Deutsch | G01R 31/2822 324/750.16 |
| 2011/0102276 A1* | 5/2011 | Jimenez et al. | 343/703 |
| 2012/0155022 A1* | 6/2012 | Alcala et al. | 361/692 |

* cited by examiner

*Primary Examiner* — Tung X Nguyen
*Assistant Examiner* — Adam Clarke
(74) *Attorney, Agent, or Firm* — Treyz Law Group, P.C.; Jason Tsai; Joseph F. Guihan

(57) ABSTRACT

Electronic devices may be tested using a test station with a test fixture. The test fixture may include a first holding structure in which a device under test may be placed and a second holding structure for supporting test probes. The second holding structure may be mated with a test probe alignment structure during test station setup operations. The test probe alignment structure may include registration features configured to set the relative position of the first and second holding structures to a known configuration and may include test probe alignment features that can be used to correctly position the placement of the test probes. If at least one of the test probes is not sufficiently aligned to its corresponding alignment feature, the test probe alignment structures will not be able to engage properly with the second holding structure, and the position of the problematic test probe may be adjusted accordingly.

10 Claims, 13 Drawing Sheets

TEST PROBE ALIGNMENT STRUCTURES FOR RADIO-FREQUENCY TEST SYSTEMS

BACKGROUND

This relates to testing and, more particularly, to testing of electronic device structures.

Electronic devices such as computers, cellular telephones, music players, and other electronic equipment are often provided with wireless communications circuitry. In a typical configuration, the wireless communications circuitry includes an antenna that is coupled to a transceiver on a printed circuit board using radio-frequency cables and connectors. Many electronic devices include conductive structures with holes, slots, and other shapes. Welds and springs may be used in forming connections between such types of conductive structures and electronic device components.

During device assembly, workers and automated assembly machines may be used to form welds, machine features into conductive device structures, connect connectors for antennas and other components to mating connectors, and otherwise form and interconnect electronic device structures. If care is not taken, however, faults may result that can impact the performance of a final assembled device. For example, a metal part may not be machined correctly or a connector may not be seated properly within its mating connector.

Methods have been developed for detecting such types of manufacturing defects during device assembly. Testing for manufacturing defects typically involves transmitting radio-frequency test signals to the electronic device structures using a test station having a test fixture and radio-frequency test probes. The electronic device structures are placed within the test fixture. The radio-frequency test probes are used to contact the electronic device structures at desired locations while the electronic device structures are secured within the test fixture. The accuracy and precision with which the radio-frequency test probes make contact to the desired locations on the electronic device structures may impact the accuracy and consistency of test results gathered across different test stations.

It would therefore be desirable to be able to provide improved ways for accurately positioning the radio-frequency test probes in each test station.

SUMMARY

Electronic device structures under test may be tested using a radio-frequency test station. The device structures under test (sometimes referred to as a DUT) may be partially-assembled devices or fully-assembled finished products.

The test station may include a test host, a test unit, and a test fixture. The test fixture may include a test probe holding structure and a DUT holding structure.

Radio-frequency test probes may be supported using the test probe holding structure. The radio-frequency test probes may be coupled to the test unit. The test unit may be configured to send and receive radio-frequency test signals to and from the device structures under test. The test results gathered using the test unit may be conveyed to the test host for further analysis.

During testing, a DUT may be placed in the DUT holding structure. The DUT may then be brought into contact with the test probes while the DUT is secured within the DUT holding structure. The location at which the test probes contact the DUT has to be sufficiently precise to provide accurate test results.

A test probe alignment structure (sometimes referred to as a gauge block) may be used to align the test probes to desired positions. The gauge block may include registration features (e.g., vertical registration features configured to set the vertical distance between the gauge block and the test probe holding structure to a known value and horizontal registration features configured to minimize the horizontal offset between the gauge block and the test probe holding structure) and test probe alignment features. The test probe alignment features may serve as mechanical guiding members for correctly positioning the different test probes.

During test station setup procedures, the gauge block may be used to mate with the test probe holding structure. The gauge block may or may not be secured within the DUT holding structure during test station setup/validation operations. The positions of each test probe may be adjusted manually or using computer-controlled positions until the each of the test probes are properly aligned to its corresponding alignment feature. When all the test probes have been aligned, the test probes may be anchored using screws, levers, clamps, welds, adhesive, solder, or other suitable attachment mechanisms for securing the placement of the test probes.

The gauge block may also be used during test station validation procedures to check whether a test station has properly aligned probes. For example, test station personnel may attempt to mate a gauge block with the test probe holding structure in a test station. If the gauge block is able to properly mate with the test probe holding structure (i.e., if the test probes are sufficiently aligned to the corresponding test probe alignment features), no adjustment needs to be made to the test probes. If the gauge block is unable to properly mate with the test probe holding structure (i.e., if at least one test probe is sufficiently offset from its corresponding test probe alignment feature), the problematic test probe(s) may be repositioned for proper alignment.

Further features of the present invention, its nature and various advantages will be more apparent from the accompanying drawings and the following detailed description.

DETAILED DESCRIPTION

Electronic devices may be assembled from conductive structures such as conductive housing structures. Electronic components such as speakers, microphones, displays, antennas, switches, connectors, and other components may be mounted within the housing of an electronic device. Electronic device structures such as these may be assembled using automated manufacturing tools.

Examples of automated manufacturing tools include automated milling machines, robotic pick-and-place tools for populating printed circuit boards with connectors and integrated circuits, computer-controlled tools for attaching connectors to each other, and automated welding machines (as examples). Manual assembly techniques may also be used in assembling electronic devices. For example, assembly personnel may attach a pair of mating connectors to each other by pressing the connectors together.

Regardless of whether operations such as these are performed using automated tools or manually, there will generally be a potential for error. Parts may not be manufactured properly and faults may arise during assembly operations. It may therefore be desirable to test an electronic device (e.g., a partially-assembled or fully-assembled electronic device) to detect for the presence of manufacturing defects during device production. For example, an electronic device (sometimes referred to as a device under test, a "DUT," or device structures under test) may be tested to determine whether its wireless circuitry satisfies performance criteria, to determine whether its conductive housing structure has properly formed gaps, to determine whether a first conductive component is welded properly to a second conductive component, to determine whether a pair of mating connectors are properly connected, etc.

Figure 1:
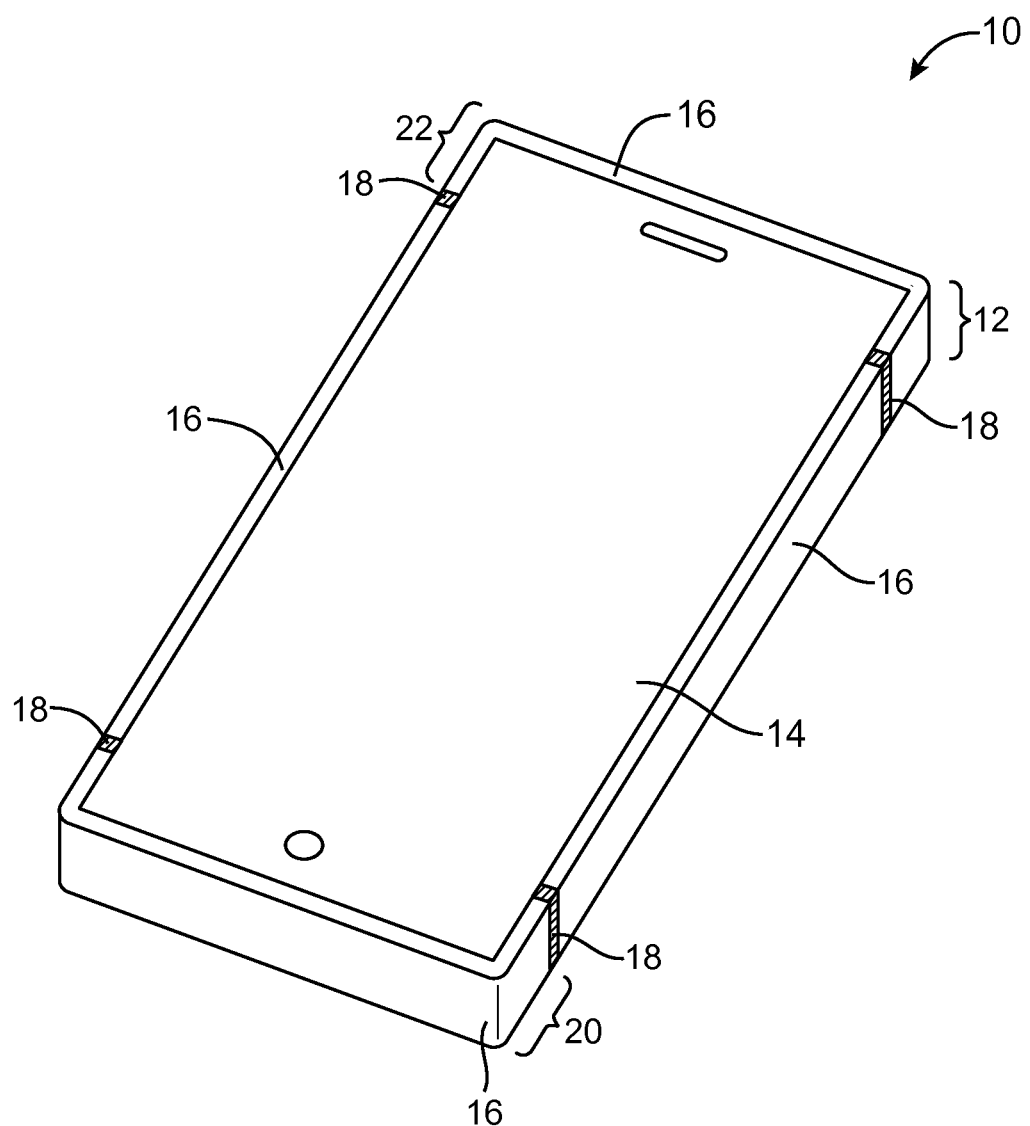
FIG. 1 is a perspective view of an illustrative electronic device that may be tested in accordance with an embodiment of the present invention.

An illustrative electronic device of the type that may be provided with conductive electronic device structures such as a peripheral conductive housing member that forms part of one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Buttons such as button 19 may pass through openings in the cover glass.

Housing 12 may include structures such as housing member 16. Member 16 may run around the rectangular periphery of device 10 and display 14. Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10.

Member 16 may be formed of a conductive material and may therefore sometimes be referred to as a peripheral conductive housing member or conductive housing structures. Member 16 may be formed from a metal such as stainless steel, aluminum, or other suitable materials. One, two, or more than two separate structures may be used in forming member 16.

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of the sidewalls of housing 12).

Display 14 may include conductive structures such as an array of capacitive electrodes, conductive lines for addressing pixel elements, driver circuits, etc. Housing 12 may include internal structures such as metal frame members, a planar housing member (sometimes referred to as a midplate) that spans the walls of housing 12 (i.e., a sheet metal structure that is welded or otherwise connected between the opposing right and left sides of member 16), printed circuit boards, and other internal conductive structures. These conductive structures may be located in center of housing 12 (as an example).

In regions 20 and 22, openings may be formed between the conductive housing structures and conductive electrical components that make up device 10. These openings may be filled with air, plastic, and other dielectrics. Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

Portions of member 16 may be provided with gap structures 18. Gaps 18 may be filled with dielectric such as polymer, ceramic, glass, etc. Gaps 18 may divide member 16 into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10 and may therefore sometimes be referred to as conductive antenna structures.

Figure 2:
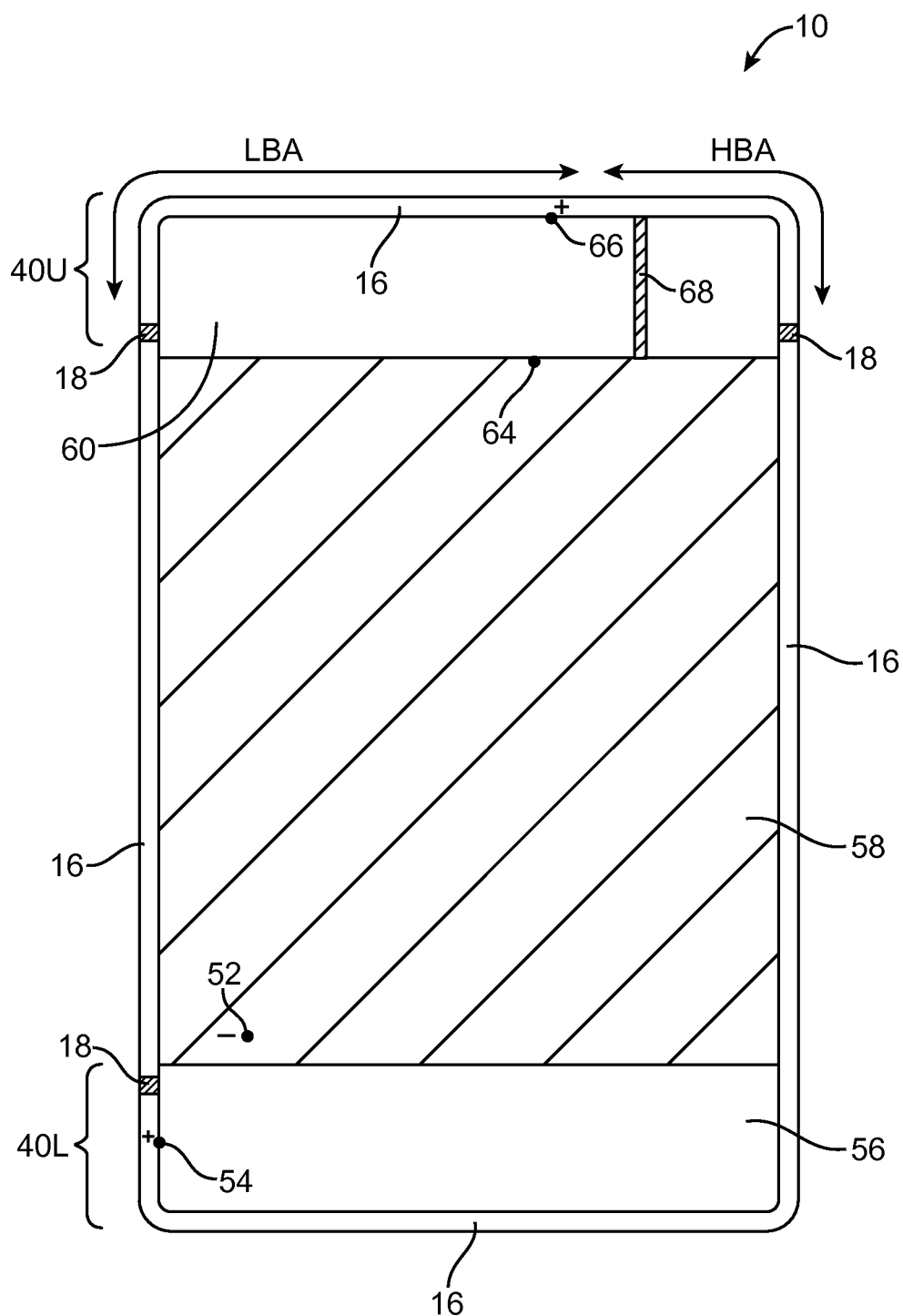
FIG. 2 is a top view of illustrative device structures under test of the type shown in FIG. 1 showing the locations of gaps in a peripheral conductive housing member in accordance with an embodiment of the present invention.

A top view of an interior portion of device 10 is shown in FIG. 2. If desired, device 10 may have upper and lower antennas (as an example). An upper antenna such as antenna 40U may, for example, be formed at the upper end of device 10 in region 22. A lower antenna such as antenna 40L may, for example, be formed at the lower end of device 10 in region 20. The antennas may be used separately to cover separate communications bands of interest or may be used together to implement an antenna diversity scheme or a multiple-input-multiple-output (MIMO) antenna scheme.

Antenna 40L may be formed from the portions of midplate 58 and peripheral conductive housing member 16 that surround dielectric-filled opening 56. Antenna 40L may have associated signal and ground feed terminals at locations 54 and 52, respectively. Other feed arrangements may be used if desired. During testing, test equipment may be used to make direct contact with these device structures precisely at locations 54 and 52 to perform radio-frequency testing (as an example). The positioning of the test equipment may be controlled so that proper contact is made at the desired locations. The arrangement of FIG. 2 is merely illustrative.

Antenna 40U may be formed from the portions of midplate 58 and peripheral conductive housing member 16 that surround dielectric-filled opening 60. Member 16 may have a low-band segment LBA that terminates at one of gaps 18 and a high-band segment HBA that terminates at another one of gaps 18. Antenna 40U may have associated signal and ground feed terminals at locations 66 and 64, respectively. During testing, a tester may be used to make physical contact with these device structures precisely at locations 66 and 64 to perform radio-frequency testing (as an example). Conductive member 68 may span opening 60 to form an inverted-F antenna short-circuit path. Segments LBA and HBA may form low-band and high-band cellular telephone inverted-F antennas (as an example).

Test equipment may be used to test electronic device 10 during production testing operations. The electronic device structures being tested may sometimes be referred to as device structures under test. The device structures under test may or may not resemble a finished product. The device structures under test may include portions of a functional electronic device such as conductive housing structures, electronic components such as microphones, speakers, connectors, switches, printed circuit boards, antennas, parts of antennas such as antenna resonating elements and antenna ground structures, metal parts that are coupled to each other using welds, assemblies formed from two or more of these structures, or other suitable electronic device structures. These test structures may be associated with any suitable type of electronic device such as a cellular telephone, a portable computer, a music player, a tablet computer, a desktop computer, a display, a display that includes a built-in computer, a television, a set-top box, or other electronic equipment.

Figure 3:
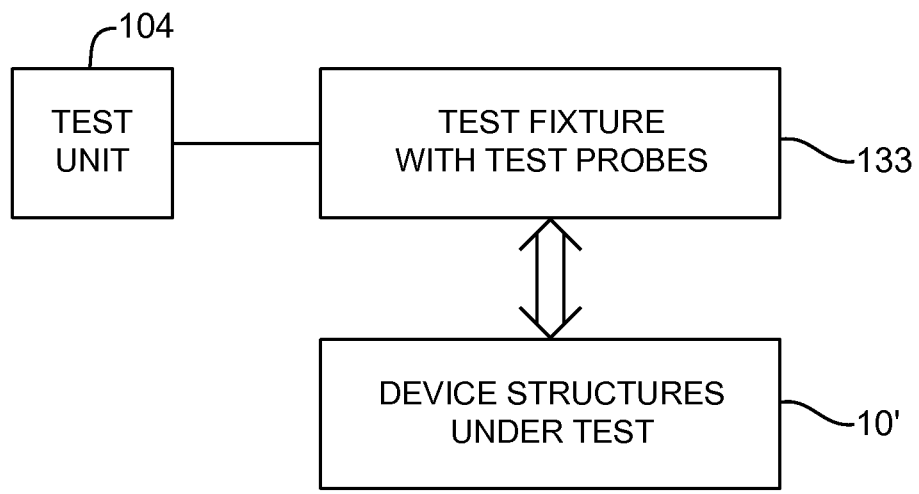
FIG. 3 is a block diagram of a test station for testing device structures under test in accordance with an embodiment of the present invention.

FIG. 3 is a diagram of device structures under test 10' being tested using a test station having test fixture 133. Test fixture 133 may include radio-frequency (RF) test probes configured to transmit and received RF test signals to and from device structures under test 10'. The test probes may be wired test probes for use in conducted testing (i.e., test probes configured to make direct contact with conductive portions of structures 10'), wireless test probes for use in radiated testing, or other types of radio-frequency test probes. As shown in FIG. 3, the test station may also include a test unit 104 to which the test probes may be coupled. Test unit 104 may serve as a signal generator for outputting radio-frequency test signals to the test probes and a radio-frequency tester for receiving and analyzing corresponding test signals received from the test probes.

Figure 4:
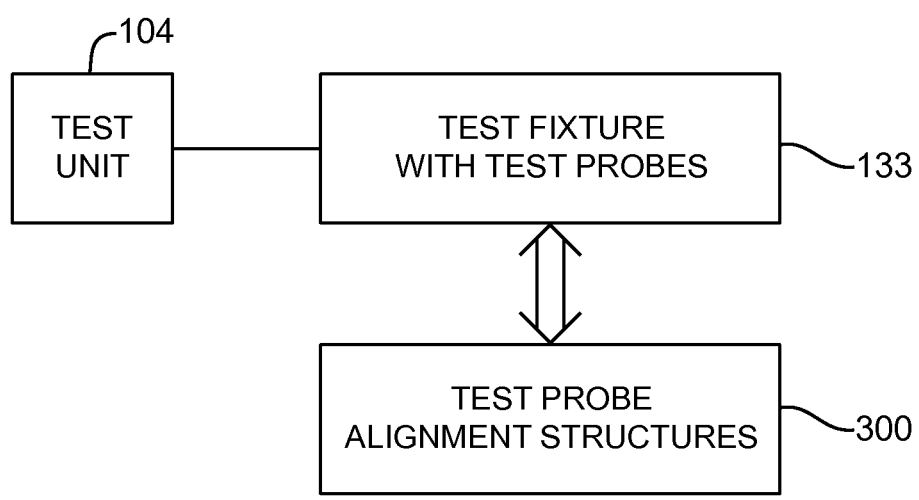
FIG. 4 is a block diagram showing how a test station may be set up using test probe alignment structures in accordance with an embodiment of the present invention.

The relative position of the test probes in test fixture 133 with respect to device structures under test 10' may affect the accuracy of the test results gathered using different test stations. Regardless of whether wired test probes or wireless test probes are used during testing, it may be desirable for the placement of the test probes in test fixture 133 to be consistent across the different test stations. This may be accomplished through the use of test probe alignment structures such as test probe alignment structures 300 (see, e.g., FIG. 4). As shown in FIG. 4, test probe alignment structures 300 may be mated with the test probes in test fixture 133 to check whether the position of each test probe is satisfactory relative to a reference test probe configuration (e.g., test probe alignment structures 300 may serve as a known reference to which the test probes in each test fixture 133 are aligned).

Test probe alignment structures 300 may, for example, be used to set up each test station during initial bring-up, to determine whether a test station is properly set up (sometimes referred to as "go/no-go" checking), etc. At least one instance of test probe alignment structures 300 may be mated with multiple test stations to set up each test station with the desired (reference) test probe configuration. If desired, multiple copies of test probe alignment structures 300 may also be used to set up the different test stations.

Figure 5:
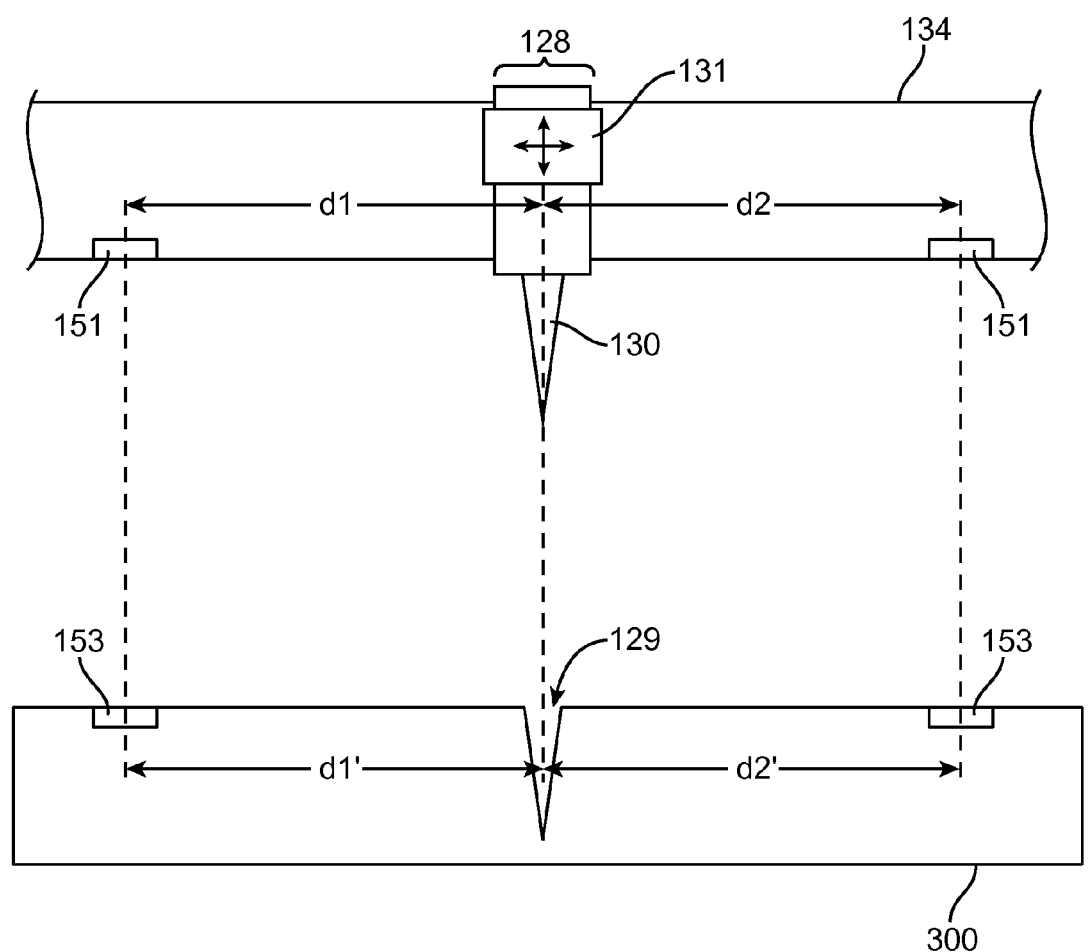
FIG. 5 is a diagram showing test probe alignment structures having a test probe alignment feature configured to mate with a corresponding test probe in a test probe holding structure in accordance with an embodiment of the present invention.

FIG. 5 is a diagram showing one arrangement in which test probe alignment structures 300 can be used to properly align a test probe in a test fixture. Test fixture 133 may include a test probe holding structure 134 configured to support at least one test probe 128 and may include an associated test probe adjustment structure 131 configured to adjust the position of test probe 128 within test probe holding structure 134. Test probe holding structure 134 may also include first and second registration features 151 (as an example). The distance between first and second registration features 151 is known and fixed (i.e., registration features 151 on test probe holding structure 134 are manufactured precisely so their locations are predictable).

As shown in FIG. 5, test probe alignment structures 300 (sometimes referred to as a gauge block) may include first and second registrations features 153 corresponding to first and second registration features 151 associated with test probe holding structure 134. As with registration features 151, the distance between first and second registration features 153 is known and fixed (i.e., registration features 153 on gauge block 300 are manufactured precisely so their locations are predicable). Mating registration features 151 and 153 may be any suitable type of engagement features that can accurately set the relative position of gauge block 300 and test probe holding structure 134 when they are in the mated state (e.g., to precisely set the vertical distance between block 300 and structure 134 and to precisely set the horizontal orientation of gauge block 300 with respect to structure 134).

The position of test probe 128 in holding structure 134 may be adjusted using test probe adjustment structure 131. Test probe adjustment structure 131 may be controlled manually or using a computer. Test probe 128 may include at least one conductive pin such as pin 130. During initial test station bring-up procedures, the position of test probe 128 may be imprecise and may vary from station to station (e.g., distances d1 and d2 between test probe 128 and registration features 151 may be incorrect/misaligned).

To ensure precise and accurate alignment of test probe 128 in test probe holding structure 134, gauge block 300 may include a test probe alignment feature 129 (e.g., a recessed portion for receiving probe pin 130) formed in its surface. The position of test probe alignment feature 129 in gauge block 300 may be accurate and consistent with a master reference configuration (e.g., distances d1' and d2' between alignment feature 129 and registration features 153 may be correct). Pin 130 and corresponding alignment feature 129 may mate properly only if test probe 128 is properly aligned. For example, if test probe 128 is horizontally offset from its desired position, pin 130 will not fit properly into recessed portion 129 and gauge block 300 will not be able to mate properly with the test fixture. If desired, gauge block 300 may include more than one test probe alignment feature 129 for use in aligning multiple test probes in test fixture 133.

Figure 6:
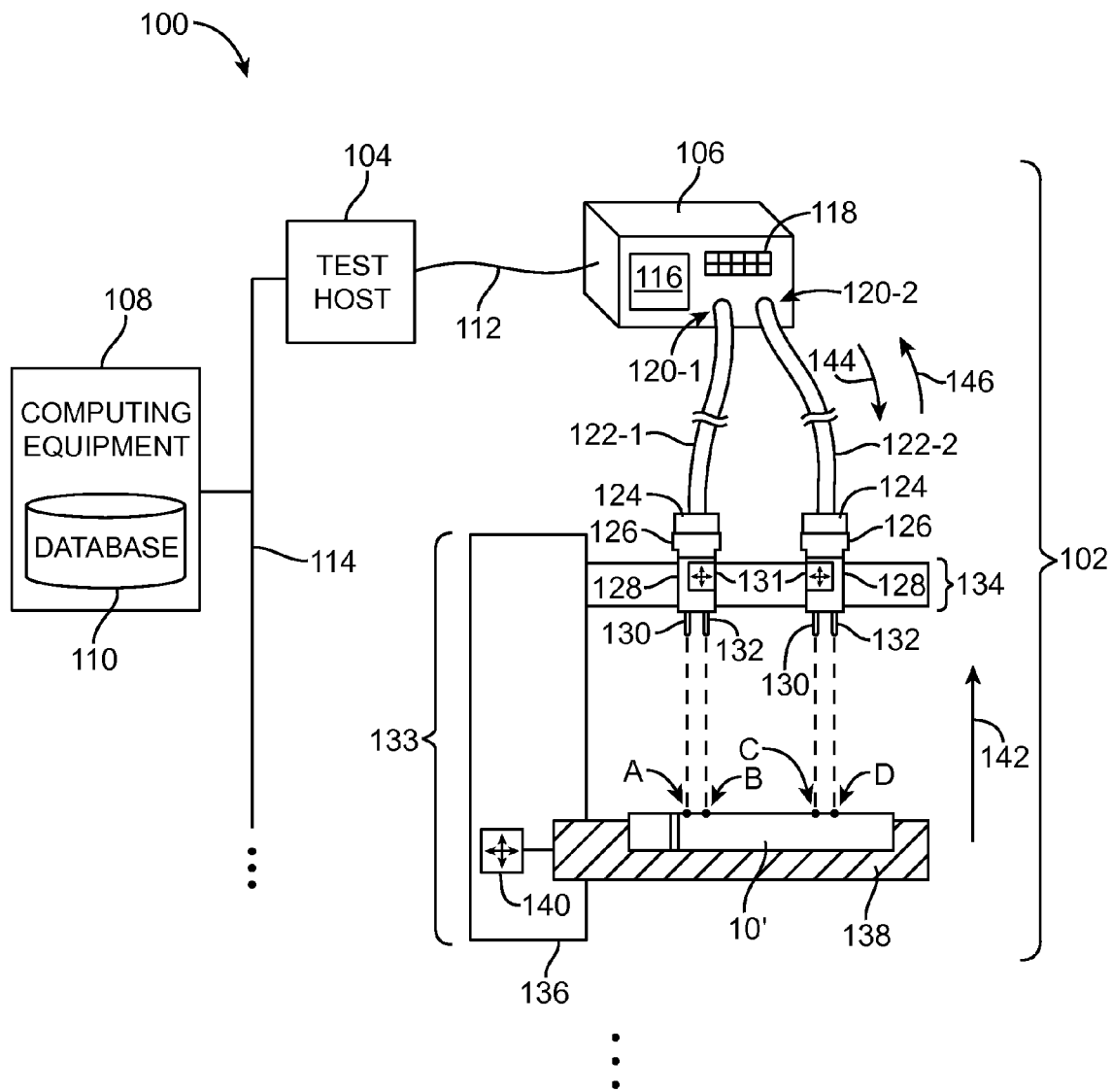
FIG. 6 is a diagram of an illustrative test station for testing device structures under test in accordance with an embodiment of the present invention.

During device assembly operations, many electronic devices (e.g., hundreds, thousands or more of DUTs 10) may be tested in a test system such as test system 100 of FIG. 6. Test system 100 may include test accessories, computers, network equipment, tester control boxes, cabling, test chambers, and other test equipment for transmitting and receiving radio-frequency test signals and gathering test results. Test stem 100 may, for example, be used to determine whether manufacturing/assembly defects are present in DUT 10 by measuring complex reflection and forward transfer coefficients, to determine whether wireless circuitry in DUT 10 satisfies performance criteria during protocol-compliant and/or non-protocol compliant testing, etc. Test system 100 may include multiple test stations such as test stations 102. There may, for example, be 80 test stations 102 at a given test site. In general, test system 100 may include any desired number of test stations to achieve desired test throughput.

Each test station 102 may include a test unit such as test unit 106 and a test host such as test host 104 (e.g., a personal computer). At least some of test stations 102 may be connected to computing equipment 108 via path 114. Computing equipment 108 may include storage equipment on which a database 110 is stored. Test results gathered using test unit 106 may be stored in database 110. Test unit (tester) 106 in each test station 102 may be a radio communications tester of the type that is sometimes referred to as a test box or a radio communications tester. Test unit 106 may be used to perform radio-frequency signaling tests for a variety of different radio-frequency communications bands and channels.

Test unit 106 may be operated directly or via computer control (e.g., when test unit 106 receives commands from test host 104). When operated directly, a user may control test unit 106 by supplying commands directly to the test unit using the user input interface of the test unit. For example, a user may press buttons in a control panel 118 on the test unit while viewing information that is displayed on a display 116 in the test unit. In computer controlled configurations, a test host such as computer 104 (e.g., software running autonomously or semi-autonomously on the computer) may communicate with the test unit (e.g., by sending and receiving data over a wired path 112 or a wireless path between the computer and the test unit).

Test unit 106 may be a multiport test box (as an example). As shown in FIG. 6, test unit 106 may have at least a first port 120-1 and a second port 120-2 to which RF cables may be connected. In the example of FIG. 6, first RF cable 122-1 may have a first end that is connected to port 120-1 and a second end that is connected to first RF connector 124, whereas second RF cable 122-2 may have a first end that is connected to port 120-2 and a second end that is connected to second RF connector 124.

Test unit 106 may be coupled to test probes 128 attached in test fixture 133. First test probe 128 may have an associated RF connector 126 that is mated with first RF connector 124, whereas second test probe 128 may have an associated RF connector 126 that is mated with second RF connector 124 (e.g., first and second test probes 128 may be respectively coupled to cables 122-1 and 122-2 via corresponding mating connectors 124 and 126). Test probes 128 may be held in place within test probe holding structure 134. The position of each test probe 128 within holding structure 134 may be adjusted using adjustment structures 131.

Test fixture 133 may also include a DUT holding structure 138 and a test fixture vertical support structure 136 configured to support holding structures 134 and 138. During testing, a DUT 10 or device structures under test 10' may be placed in a cavity within DUT holder 138. In one suitable arrangement, the position of DUT holder 138 may be controlled using positioner 140. Positioner 140 may, for example, include actuators for controlling the vertical movement of DUT holder 138 (as an example). When device structures under test 10' are mounted within DUT holder 138, DUT holder 138 may be moved vertically in direction 142 so that test probes 128 make direct contact with corresponding portions of structures 10'. For example, each test probe 128 (e.g., a pogo pin test probe) may include signal pin 130 and ground pin 132. In the mated state, the signal and ground pins of first test probe 128 may make respectively contact at locations A and B on device structures 10', whereas the signal and ground pins of second test probe 128 may make respect contact at locations C and D on device structures 10'.

Test system 100 of FIG. 6 is merely illustrative and is not intended to limit the scope of the present invention. If desired, test fixture 133 may include any number of test probes 128 (e.g., more than two test probes, more than four test probes, etc.). Test station 102 may include any number of test units 106 each with sufficient number of ports to supply and receive radio-frequency test signals to the different test probes in test fixture 133. Device structures 10' may be mated with test probes 128 manually or semi-automatically by moving only test probe holding structure 134, by moving only DUT holding structure 138, or by moving both structures 134 and 136.

Figure 7:
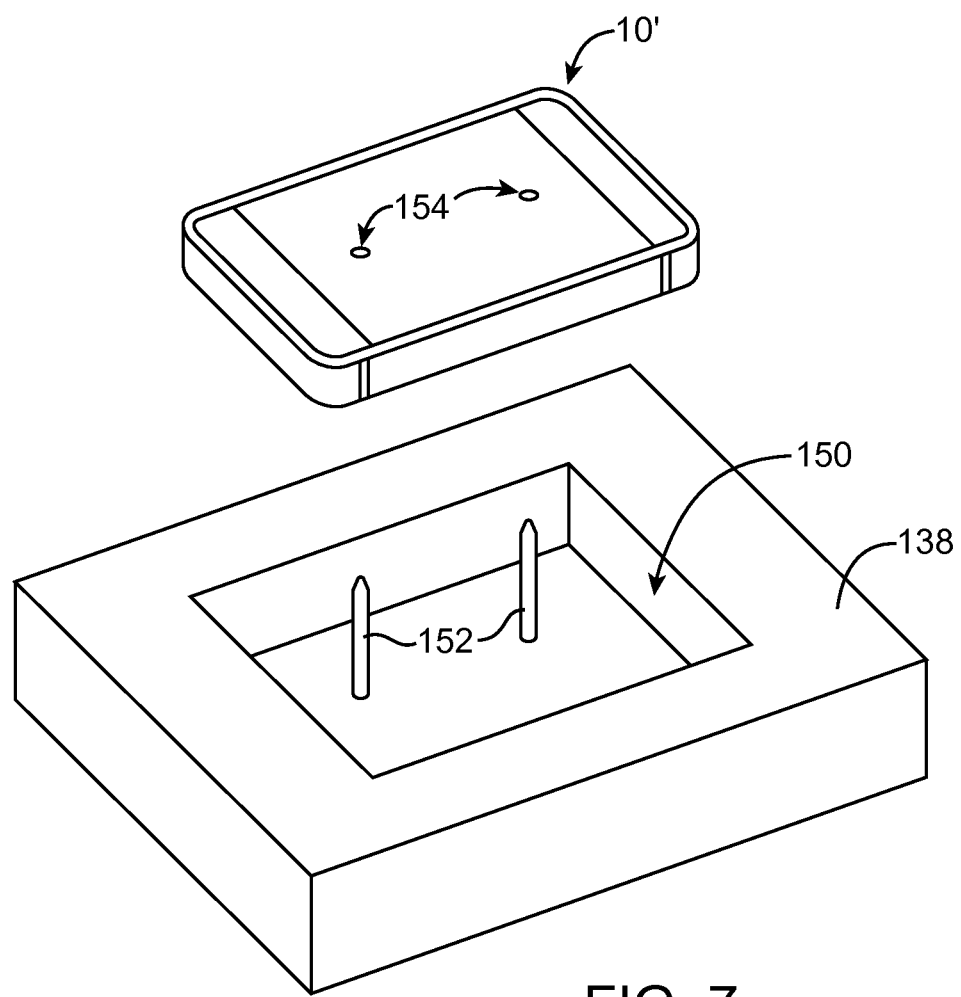
FIG. 7 is a perspective view of an illustrative holding structure in which device structures under test may be inserted in accordance with an embodiment of the present invention.

FIG. 7 is a perspective view of DUT holding structure 138 having a cavity 150 in which device structures under test 10' may be temporarily mounted during testing. As shown in FIG. 7, at least two protruding members 152 may be formed within cavity 150. Device structures under test 10' may have corresponding engagement features 154 (e.g., holes) through which protruding members 152 may be inserted. Protruding members 152 may serve as registration features for DUT holding structure 138 so that the horizontal placement of device structures under test 10' is set to a known and precise position when device structures under test 10' are placed in DUT holding structure 138. If desired, device structures under test 10' may be secured to the known position using other types of engagement features.

Figure 8:
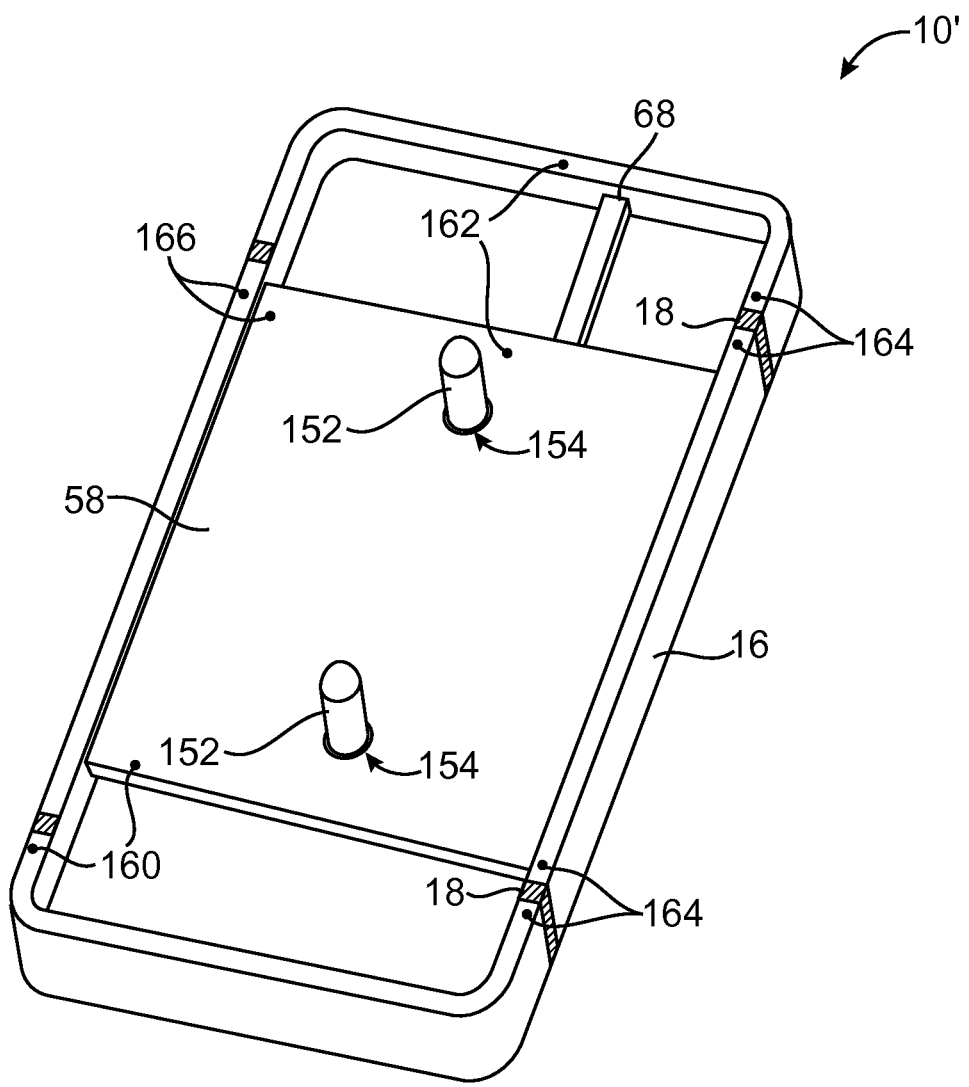
FIG. 8 is a perspective view of illustrative device structures under test showing locations of possible probe points in accordance with an embodiment of the present invention.

FIG. 8 shows device structures under test 10' when it is mated with DUT holding structure 138. As shown in FIG. 8, protruding members 152 are inserted through holes 154 in midplate 58. During testing, it may be desirable to probe various parts of device structures under test 10'. Indicator pairs 160, 162, 164, and 166 show possible pairs of probe points at which the test probes should contact device structures under test 10' during testing. For example, indicator pair 160 shows that it may be desirable to place a pair of signal and ground pins in a first test probe at the signal and ground feed points for the lower antenna, where as indicator pair 162 shows that it may be desirable to place a pair of signal and ground pins in a second test probe at the signal and ground feed points for the upper antenna. Indicator pair 164 shows that it may be desirable to place the signal and ground pins in a third test probe at opposing ends of gap 18 to test whether that gap is properly formed. Indicator pair 166 shows that it may be desirable to place the signal and ground pins of a fourth test probe in contact with member 16 and midplate 58, respectively, to determine whether member 16 and midplate 58 are properly welded to each other. If any of the test probes is slightly offset from their intended position (e.g., if any of the test probes is offset by more than 0.1 mm, more than 2 mm, more than 5 mm, etc.), the signal and ground pins of the erroneously positioned test probe will not be able to make proper contact with device structures under test 10'. Gauge block 300 may therefore be used to ensure that each of test probes 128 in the test fixture is positioned properly.

Figure 9A:
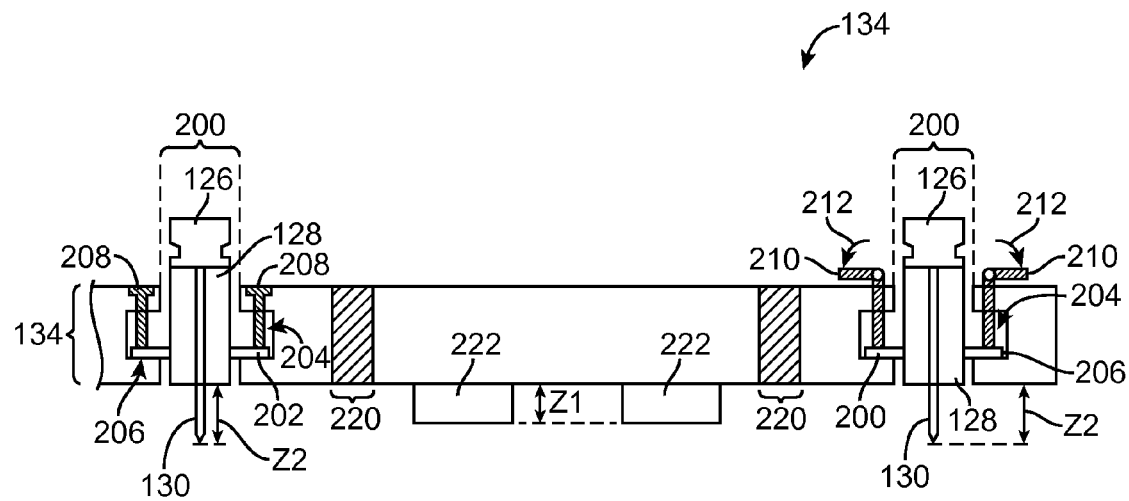
FIG. 9A is a cross-sectional side view of an illustrative test probe holding structure in accordance with an embodiment of the present invention.

FIG. 9A is a cross-sectional side view of one suitable arrangement of test probe holding structure 134 configured for use with the DUT holding structure of the type described in connection with FIG. 7. As shown in FIG. 9A, test probe holding structure 134 may include at least two holes 220 through which protruding member 152 (of FIGS. 7 and 8) may be inserted and protruding structures 222 that protrude out from the bottom surface of test probe holding structure 134 at a length Z1. Pin 130 in each test probe 128 may, for example, protrude out from the bottom surface of test probe holding structure 134 at a length Z2 that is greater than Z1, equal to Z1, or less than Z1.

Holes 220 serve to receive protruding member 152 for horizontal registration of device structures under test 10' (e.g., to set the relative horizontal positions of test probes 128 and device structures under test 10' to a known value when they are in the mated state), whereas protruding structures 222 serve to make contact with the surface of midplate 58 for vertical registration of device structures under test 10' (e.g., to set the vertical distance between test probes 128 and device structures under test 10' to a known value when they are in the mated state). Structures 220 and 222 may therefore sometimes be referred to as horizontal registration features and vertical registration features, respectively. Holes 220 and structures 222 represent one suitable implementation for registration features 151 in test probe holding structure 134 described in connection with FIG. 5.

In the example of FIG. 9A, the position of first and second test probes 128 may be adjusted by an operator by manually shifting their position within respective test probe adjustment regions 200. Test probe 128 may have supporting members 202 resting on corresponding surfaces 206 in respectively cavities 204. The position of first test probe 128 may be secured using screws 208 (e.g., screws that clinch the position of the test probe within region 200), whereas the position of second test probe 128 may be secured using a lever mechanism 210 (e.g., levers that lock the position of the test probe within region 200 when turned in the direction of arrow 212). In general, the positions of test probes 128 within test probe holding structure 134 may be secured by screwing, clamping, soldering, welding, gluing, or using other permanent/temporary attachment mechanisms.

Figure 9B:
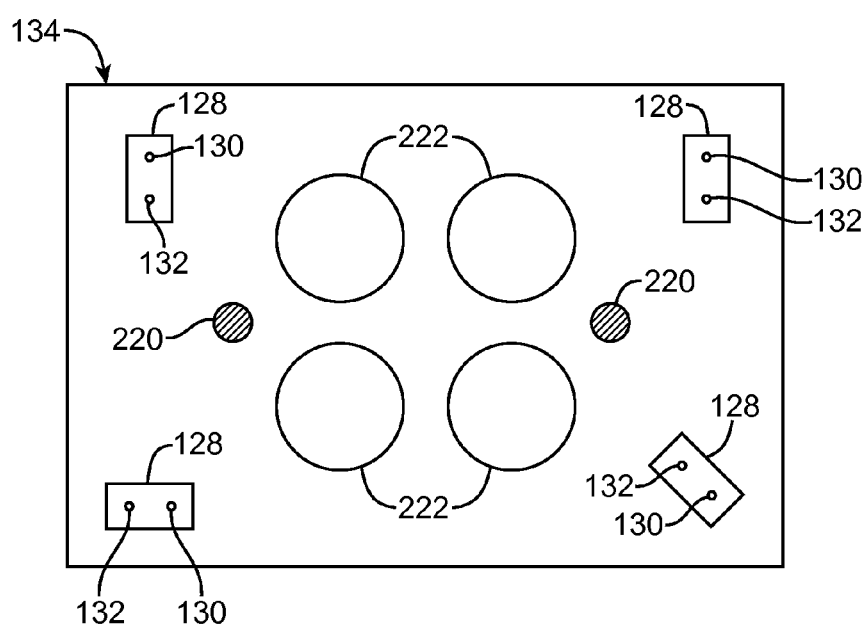
FIG. 9B is a bottom view of the test probe holding structure of FIG. 9A in accordance with an embodiment of the present invention.

FIG. 9B shows the bottom view of test probe holding structure 134. As shown in FIG. 9B, there may be four protruding registration features 222, two recessed registration features 220, and four test probes 128 positioned within test probe holding structure 134. The example of FIG. 9B is merely illustrative and is not intended to limit the scope of the present invention. If desired, there may be more than two horizontal registration features 220, less than four vertical registration features 222, and any number of test probes 128 in any suitable configuration within test probe holding structure 134.

Figure 10:
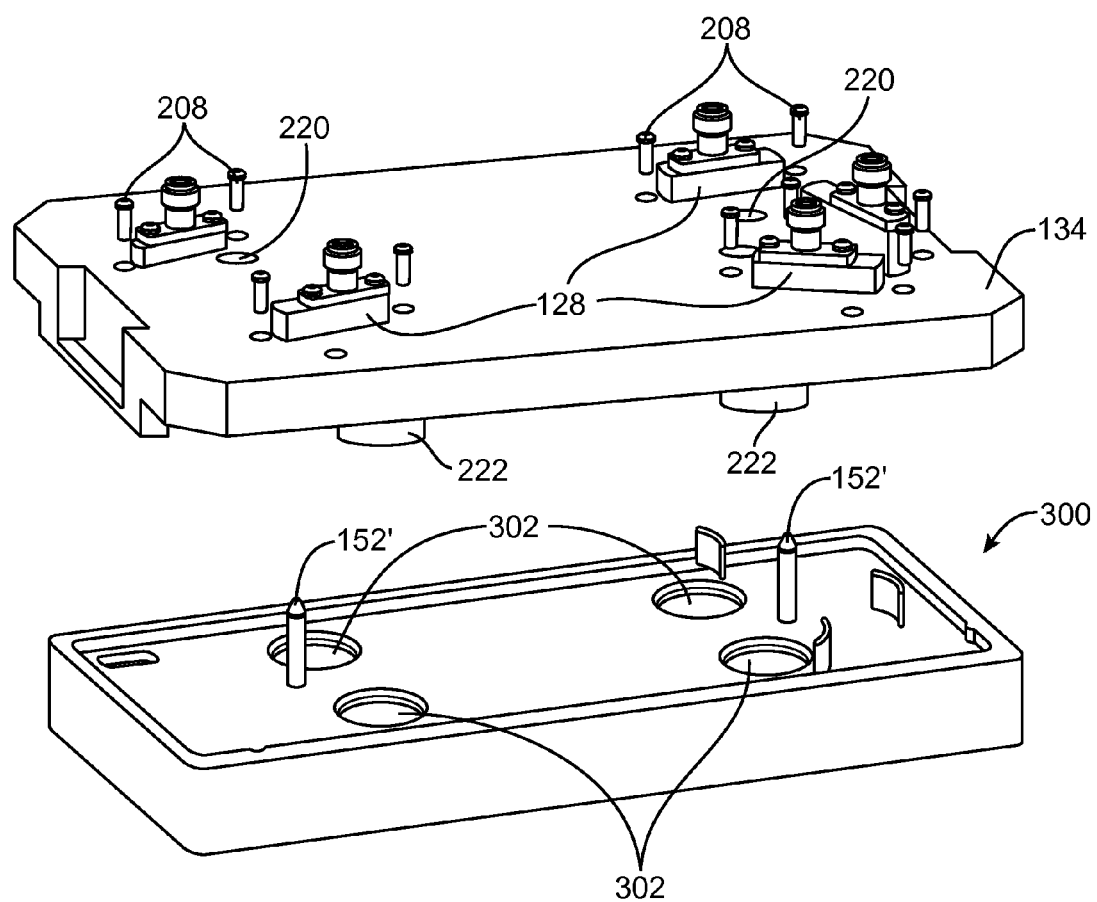
FIG. 10 is an exploded perspective view of illustrative test probe alignment structures that may be mated with corresponding test probes in a test probe holding structure of the type shown in FIGS. 9A and 9B in accordance with an embodiment of the present invention.

FIG. 10 is an exploded perspective view of illustrative gauge 300 configured to mate with test probe holding structure 134. As shown in FIG. 10, test probe holding structure 134 may have five test probes 128 that can be secured within structure 134 using screws 208. Gauge block 300 may be formed from a piece of material (e.g., a block of plastic, dielectric material, metal, conductive material, or other suitable type of material). Gauge block 300 may include recessed portions 302 configured to engage with vertical registration features 222 associated with test probe holding structure 134. Gauge block 300 may have at least two holes through with members 152 (see, e.g., FIGS. 7 and 8) may be inserted when gauge block is placed in DUT holding structure 138.

In another suitable arrangement, these horizontal registration features 152' may be formed as an integral part of gauge block 300 (e.g., gauge block 300 need not be placed within DUT holding structure 138 during test probe alignment procedures). Structures 152' and 302 may represent one implementation of gauge block registration features 153 of the type described in connection with FIG. 5.

Figure 11:
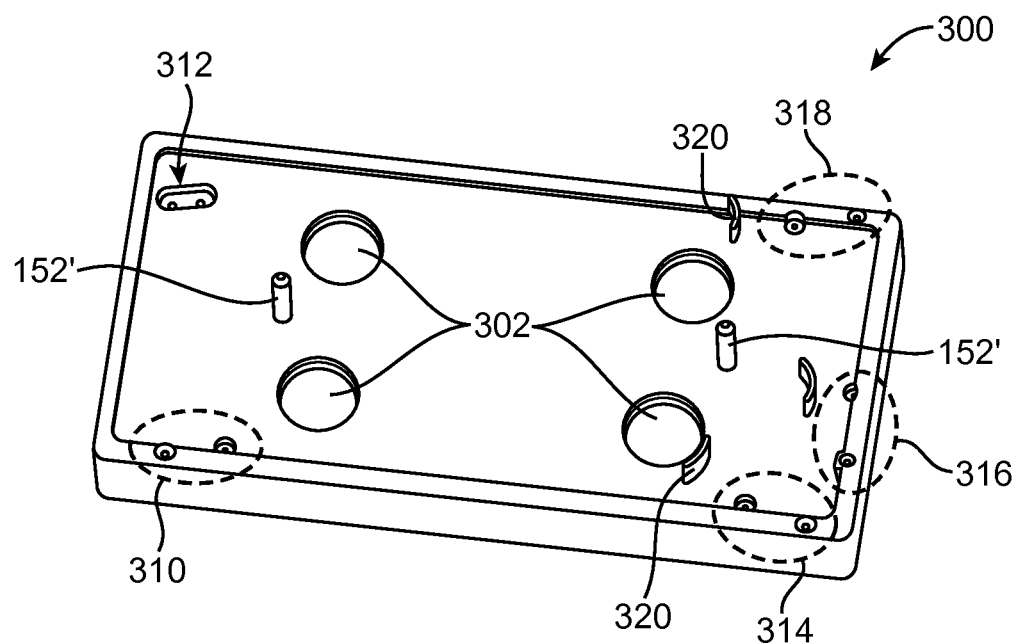
FIGS. 11 and 12 are perspective views of illustrative test probe alignment structures in accordance with an embodiment of the present invention.

Gauge block 300 of FIG. 10 may include test probe alignment features corresponding to different test probes 128 in test probe holding structure 134 (see, e.g., FIG. 11). As shown in FIG. 11, recessed portions 310, 312, 314, 316, and 318 may represent alignment features corresponding to signal and ground pins 130 and 132 in the five respective test probes 128 in FIG. 10. These test probe alignment features in gauge block 300 are manufactured precisely to help guide test probes 128 to their desired positions within test probe holding structure 134. Additional guiding features such as structures 320 may be formed on the surface of gauge block 300 to provide additional retention force and mechanical support for gauge block 300 while it is mated with test probe holding structure 134.

Figure 12:
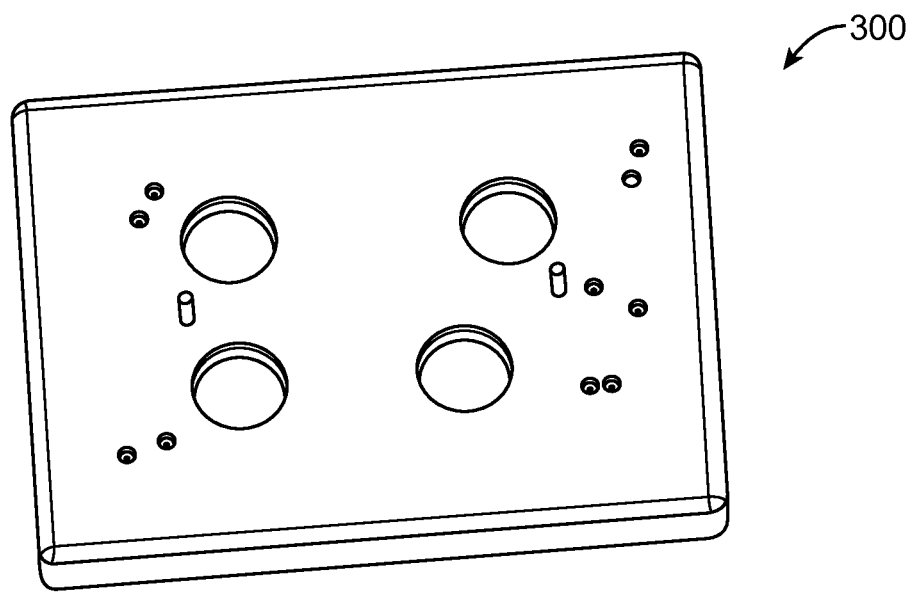

Different types of electronic devices may have different shapes and structures for test. Different test stations may be assembled to test these different device structures. As a result, different gauge blocks 300 associated with the different devices may be used to set up the different test stations. As an example, the gauge block of FIG. 12 may have test probe alignment features formed at different locations in comparison to the gauge block of FIG. 11.

Figure 13:
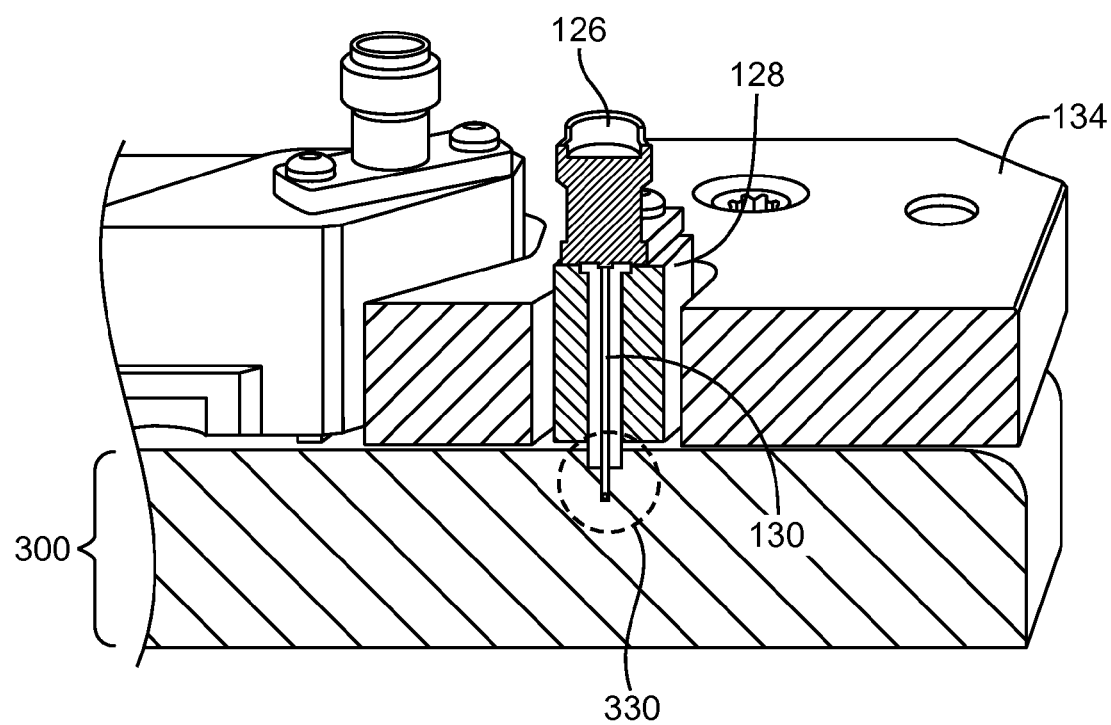
FIG. 13 is a cross-sectional view showing a test probe mated with a corresponding test probe alignment feature in accordance with an embodiment of the present invention.

FIG. 13 is a cross-sectional side view of gauge block 300 when it is mated with test probe holding structure 134. If test probe 128 is positioned correctly, signal pin 130 will mate properly with alignment feature 330 so that the surfaces of structure 134 and block 300 are in direct contact, as shown in FIG. 13. If test probe 128 is slightly offset from its correct position, however, signal pin 130 will not be aligned with feature 3330 and the surfaces of structure 134 and block 300 will not be able to make direct contact. In such scenarios, an alert may be sent to the operator indicating that at least one of test probes 128 in test probe holding structure 134 is misaligned. This is merely illustrative. The surface of structures 134 and 300 need not be in direct contact to indicate proper test probe alignment. For example, proper test probe alignment can be determined as long as the distance between structures 134 and 300 is less than a predetermined value.

Figure 14:
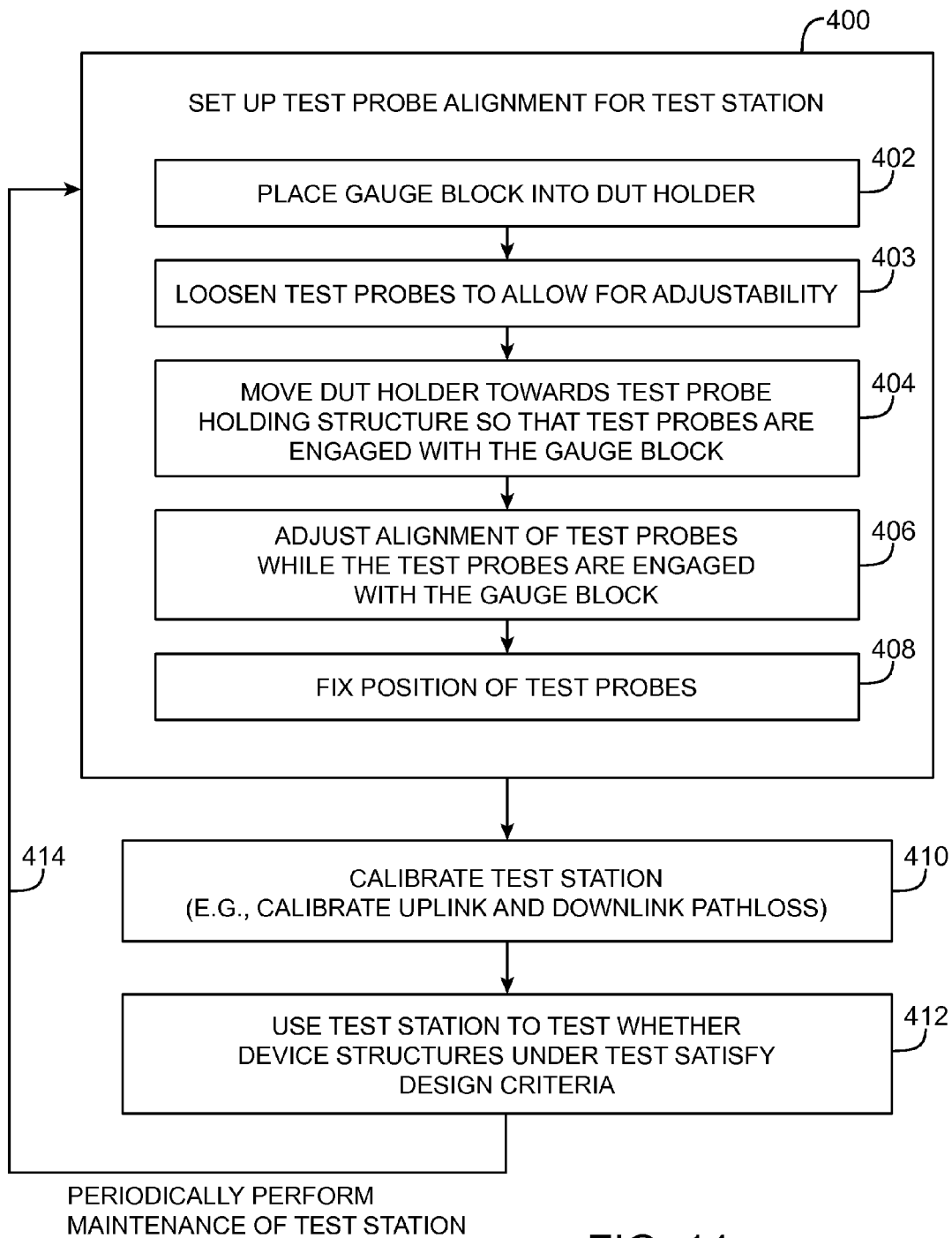
FIG. 14 is a flow chart of illustrative steps involved in initially setting up a test station in accordance with an embodiment of the present invention.

FIG. 14 is a flow chart of illustrative steps involved in initially setting up a test station. To set up proper test probe alignment for a given test station (step 400), gauge block 300 may first be place into DUT holding structure 138 (step 402). At step 403, the test probes may be placed in an adjustable state to reduce the possibility of damaging the test probes in step 404 (e.g., test probe fasteners may be loosened or other test probe securing mechanisms may be temporarily alleviated to allow for movement in the position of the test probes). At step 404, DUT holding structure 138 may be moved towards test probe holding structure 134 so that gauge block 300 is engaged with the test probes. At step 406, the position of each of the test probes may be adjusted (manually or semi-automatically) so that the test probes are properly mated with the corresponding test probe alignment features in gauge block 300. At step 408, the test probes may be secured by tightening associated test probe fasteners or using other suitable mechanisms for fixing the position of the test probes (e.g., screws, levers, solder, welds, adhesive material, etc.).

At step 410, the test unit may be powered on and the test station may be calibrated using at least one reference DUT (e.g., the reference DUT may be used to calibrate downlink and uplink path loss characteristics associated with the test station). Other test station characteristics may also be calibrated during step 410.

At step 412, the test station is ready for use and may be used to test whether partially-assembled device structures under test 10' or fully-assembled electronic devices 10 satisfy design criteria. Processing may loop back to step 400 periodically for test station maintenance purposes (e.g., to ensure that the positions of the test probes have not shifted after some period of use), as indicated by path 414.

Figure 15:
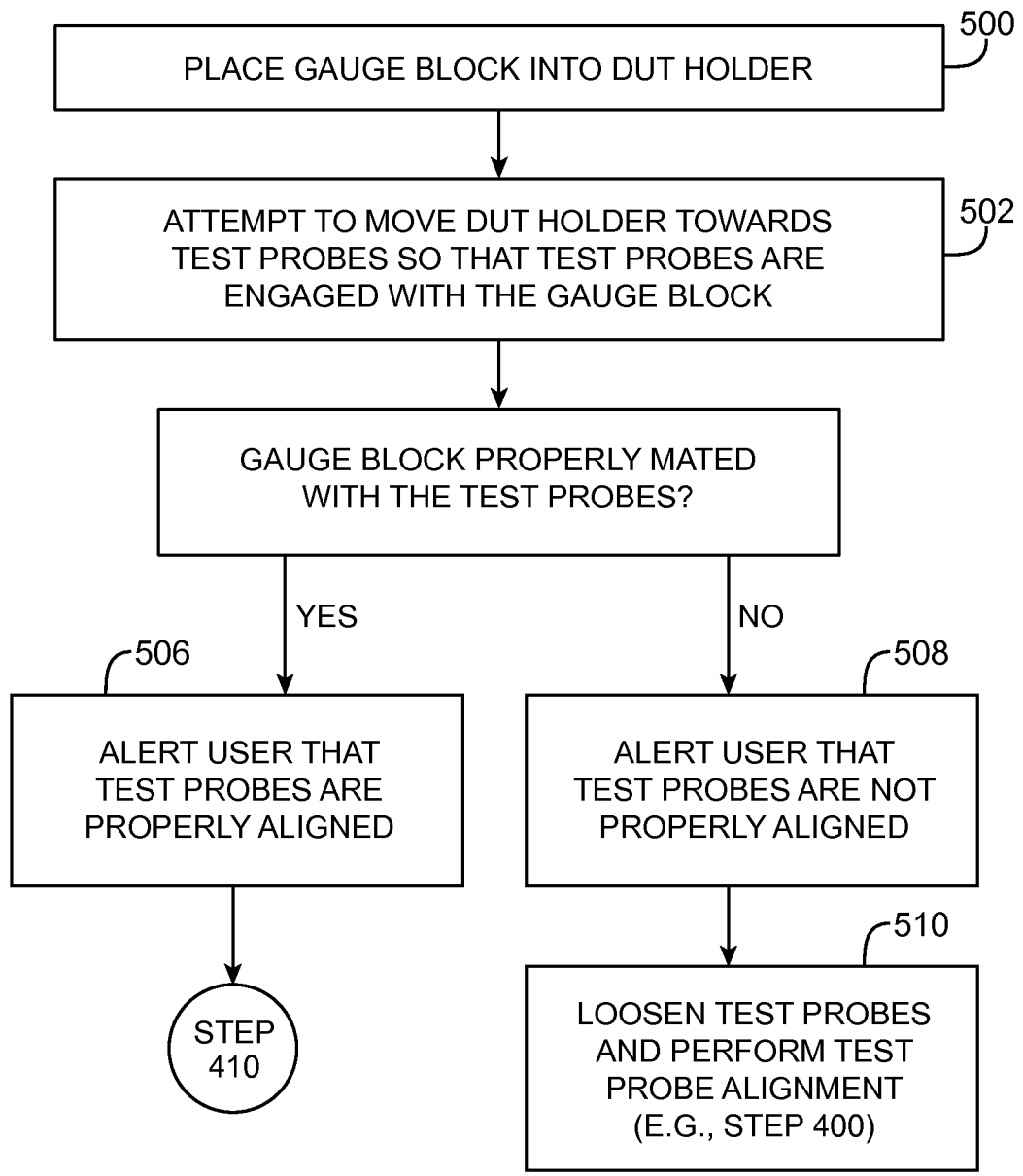
FIG. 15 is flow chart of illustrative steps for determining whether a test station has properly aligned test probes in accordance with an embodiment of the present invention.

Gauge block 300 may also be used as a tool for checking whether a test station is properly set up or exhibits misaligned test probes (i.e., for go/no-go or maintenance checking). At step 500, gauge block 300 may have placed into DUT holding structure 138. At step 502, an operator may attempt to move DUT holding structure 138 towards test probe holding structure 134. If gauge block 300 is able to properly mate with the test probes (e.g., if the distance between gauge block 300 and test probe holding structure 134 is less than a predetermined value), an alert may be sent to the operator indicating that the test probes are properly aligned and processing may proceed to step 410 (FIG. 15). If gauge block 300 is unable to properly engage with at least one of the test probes (e.g., if the distance between gauge block 300 and test probe holding structure 134 exceeds the predetermined value), an alert may be sent to the operator indicating that at least one of the test probes is misaligned. In such scenarios, the test probes may be loosened so that the position of the test probes may be readjusted to their desired positions (see, e.g., step 400 in FIG. 14).

The foregoing is merely illustrative of the principles of this invention and various modifications can be made by those skilled in the art without departing from the scope and spirit of the invention. The foregoing embodiments may be implemented individually or in any combination.

What is claimed is:

1. A method for configuring at least one test probe that is located at an adjustable position within a test fixture in a radio-frequency test station, comprising:

placing a test probe alignment structure into alignment with the test fixture; and while the test probe alignment structure and the test fixture are aligned, adjusting the position of the test probe with respect to the test fixture and the test probe alignment structure so that the test probe aligns with at least one corresponding test probe alignment feature in the test probe alignment structure, wherein adjusting the position of the test probe with respect to the test fixture and the test probe alignment structure so that the test probe aligns with at least one corresponding test probe alignment feature in the test probe alignment structure comprises moving the test probe horizontally within a test probe adjustment region, with respect to the test fixture and the test probe alignment structure, so that the test probe protrudes vertically into the at least one corresponding test probe alignment feature in the test probe alignment structure.

2. The method defined in claim 1 wherein placing the test probe alignment structure into alignment with the test fixture comprises registering the test probe alignment structure with the test fixture using mating registration features in the test probe alignment structure and the test fixture.

3. The method defined in claim 2 further comprising:

following adjustment of the test probe into alignment with the at least one corresponding test probe alignment feature, securing the test probe to the test fixture using an attachment mechanism selected from the group consisting of: welds, screws, clamps, levers, adhesive, and solder.

4. The method defined in claim 2 wherein a first portion of the mating registration features in the test fixture comprises at least one protruding member, wherein a first portion of the mating registration features in the test probe alignment structure comprises at least one corresponding recess, and wherein registering the test probe alignment structure with the test fixture comprises mating the at least one protruding member of the test fixture with the at least one corresponding recess in the test probe alignment structure.

5. The method defined in claim 4 wherein a second portion of the mating registration features in the test fixture comprises at least one recess, wherein a second portion of the mating registration features in the test probe alignment structure comprises at least one corresponding protruding member, and wherein registering the test probe alignment structure with the test fixture further comprises mating the at least one recess of the test fixture with the at least one corresponding protruding member in the test probe alignment structure.

6. The method defined in claim 2 wherein a portion of the mating registration features in the test fixture comprises at least one recess, wherein a portion of the mating registration features in the test probe alignment structure comprises at least one corresponding protruding member, and wherein registering the test probe alignment structure with the test fixture further comprises mating the at least one recess of the test fixture with the at least one corresponding protruding member in the test probe alignment structure.

7. The method defined in claim 1 wherein the at least one corresponding test probe alignment feature comprises a recess within a block of material, and wherein adjusting the position of the test probe within the test fixture so that the probe aligns with the at least one corresponding test probe alignment feature in the test probe alignment structure comprises adjusting the position of the test probe until the test probe is aligned with the recess within the block of material.

8. A method for determining whether a radio-frequency test probe is located at a proper position within a test fixture, wherein the test fixture includes registration features corresponding to registration features in a test probe alignment structure, comprising:
- attempting to mate the test probe with a test probe alignment feature in the test probe alignment structure while mating the registration features of the test fixture with the registration features of the test probe alignment structure;
- following an unsuccessful attempt at mating the test probe with the test probe alignment feature while mating the registration features of the test fixture with the registration features of the test probe alignment structure, adjusting where the test probe is positioned with respect to the test fixture and the test probe alignment structure;
- following successful mating of the test probe with the test probe alignment feature while mating the registration features of the test fixture with the registration features of the test probe alignment structure, removing the test probe alignment structure from the test fixture;
- inserting at least a given one of the registration features of the test fixture through an opening in a device under test; and
- while the given one of the registration features is within the opening of the device under test, testing the device under test using the radio-frequency test probe.

9. The method defined in claim 8 wherein adjusting where the test probe is positioned with respect to the test fixture and the test probe alignment structure comprises adjusting the test probe to the proper position within the test fixture so that the test probe is in alignment with the test probe alignment feature.

10. The method defined in claim 9 further comprising:
- following adjustment of the test probe into alignment with the test probe alignment feature, securing the test probe to the test fixture such that the test probe does not move with respect to the test fixture using an attachment mechanism selected from the group consisting of: welds, screws, clamps, levers, adhesive, and solder.

* * * * *